United States Patent [19]

Jacoby

[11] Patent Number: 5,794,684
[45] Date of Patent: Aug. 18, 1998

[54] STACKED FIN HEAT SINK CONSTRUCTION AND METHOD OF MANUFACTURING THE SAME

[76] Inventor: John Jacoby, Jackson Pond Rd., New Hampton, N.H. 03256

[21] Appl. No.: 745,751

[22] Filed: Nov. 8, 1996

[51] Int. Cl.$^6$ .................................................. F28F 7/00
[52] U.S. Cl. .................... 165/80.3; 165/185; 174/16.3; 257/722; 361/704; 361/707
[58] Field of Search .............................. 165/80.3, 185; 174/16.3; 257/722; 361/690, 704, 707

[56] References Cited

U.S. PATENT DOCUMENTS

| | | | |
|---|---|---|---|
| 2,806,187 | 9/1957 | Boyer et al. | 165/185 |
| 4,107,934 | 8/1978 | Beitner | 165/185 X |
| 5,224,538 | 7/1993 | Jacoby | 165/185 X |
| 5,535,816 | 7/1996 | Ishida | 165/80.3 |
| 5,654,587 | 8/1997 | Schneider et al. | 257/722 X |

*Primary Examiner*—Leonard R. Leo
*Attorney, Agent, or Firm*—Salter & Michaelson

[57] ABSTRACT

A heat sink is constructed from a plurality of fin elements each of which has upper and lower heat dissipating surfaces. The upper surface is provided with a centrally located nesting recess while the lower surface is provided with a centrally located nesting shoulder which is complementary in shape to the recess. The fin elements are assembled in interfitting stacked relation such that the nesting shoulder of one fin element is received in nested relation within the recess of an adjacent fin element and further assembled such that the outer side and bottom walls of the shoulder are in intimate facing thermal contact with the inner side and bottom walls of the recess. The side walls of the shoulder and recess of consecutively nested fin elements are consecutively longer in length, i.e. the recess is deeper and shoulder higher, so that the heat dissipating surfaces of the adjacent fin elements are maintained in spaced relation. The nesting formations of the fin elements are preferably formed by stamping the center portion of the fin elements to produce a recess on the stamped side while also forming the complementary shoulder on the opposing side. During assembly of the various fin elements, the nested formations are bonded together using a bonding technique appropriate to the particular metal used for the fin elements. The heat dissipating surfaces of the fin elements are also preferably provided with embossed surface formations to increase the effective heat dissipating surface area of the fin elements.

7 Claims, 2 Drawing Sheets

5,794,684

STACKED FIN HEAT SINK CONSTRUCTION AND METHOD OF MANUFACTURING THE SAME

BACKGROUND AND SUMMARY OF THE INVENTION

The instant invention generally relates to heat dissipation devices or "heat sinks", and more particularly to a heat sink constructed from a plurality of embossed fin elements which are stacked in nesting relation to form a multiple fin heat sink.

Heat sinks are well known in the electronics industry for cooling semiconductor substrates, thermoelectric modules and other electronic devices which generate heat during use. Reference can be made to the U.S. Pat. No. 5,224,538 to Jacoby as a representative example of the prior art. While the prior art heat sink devices function effectively for their intended purposes, their is always a constant desire to improve the efficiency of heat sink devices, and to lower the manufacturing costs for such devices.

The instant invention provides a highly effective, low cost, heat sink construction comprising a plurality of nested fin elements each of which has upper and lower heat dissipating surfaces. The upper surface of each fin element includes a centrally located nesting recess while the lower surface includes a centrally located nesting shoulder which is complementary in shape to the recess. The fin elements are assembled in interfitting stacked relation such that the nesting shoulder of one fin element is received in nested relation within the recess of an adjacent fin element. The nesting formations of the fin elements are preferably formed by stamping the center portion of the thin metal fin elements to produce a recess on the stamped side while also forming the complementary shoulder on the opposing side. In this regard, the side walls of the shoulder and recess of consecutively nested fin elements are formed consecutively longer in length, i.e. the embossed recess is deeper and shoulder higher, so that when the fin elements are nested together the heat dissipating surfaces of the adjacent fin elements are maintained in spaced relation and the outer side and bottom walls of the shoulder are nested in intimate facing thermal contact with the inner side and bottom walls of the recess. The intimate thermal contact between the nested portions of the fin elements provides efficient heat transfer between the substrate to be cooled and the heat dissipating surfaces of the heat sink construction. To further enhance heat transfer between the fin elements, the nested formations are bonded together using a bonding technique appropriate to the particular metal used for the fin elements. Still further, to enhance the heat dissipating efficiency of the fin elements, the heat dissipating surfaces of the fin elements are preferably provided with embossed surface formations to increase the effective heat dissipating surface area of the fin elements. The embossed surface formations are also preferably formed by a stamping operation to form small bumps and recesses on the surfaces.

Accordingly, among the objects of the instant invention are: the provision of a highly efficient low cost heat sink device; the provision of a heat sink device which can be easily manufactured using known manufacturing techniques; the provision of a heat sink device which is constructed from a plurality of similar fin elements; and the provision of a heat sink which can be effectively manufactured and assembled with very little human labor.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE PREFERRED EMBODIMENT

Figure 1:
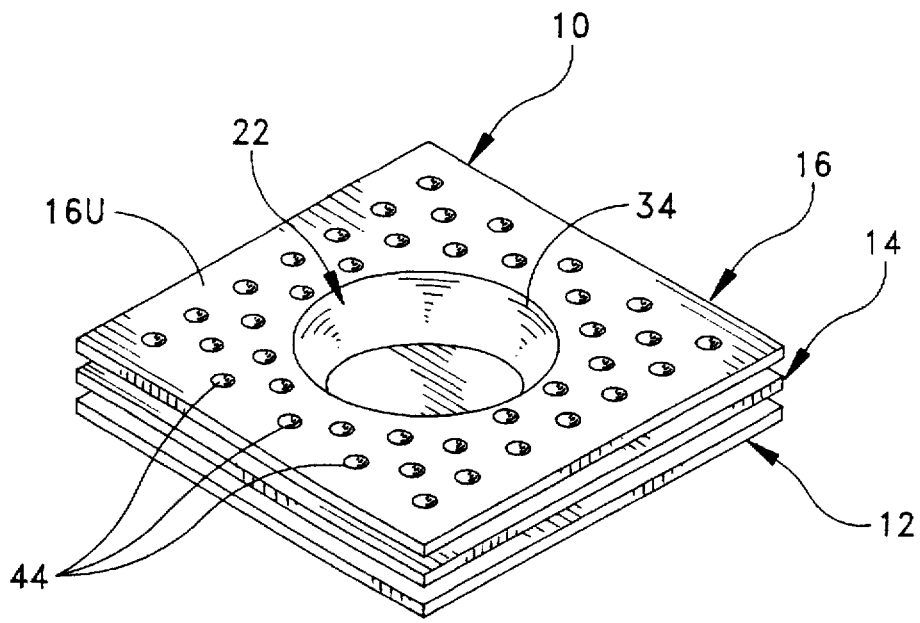
FIG. 1 is a perspective view of the heat sink device of the instant invention.
Figure 2:
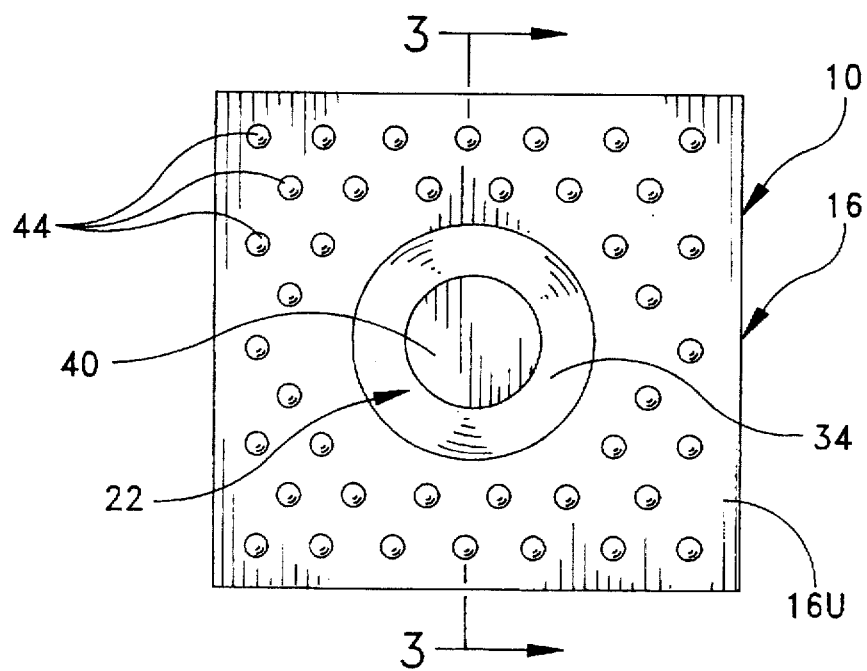
FIG. 2 is a plan view thereof
Figure 2A:
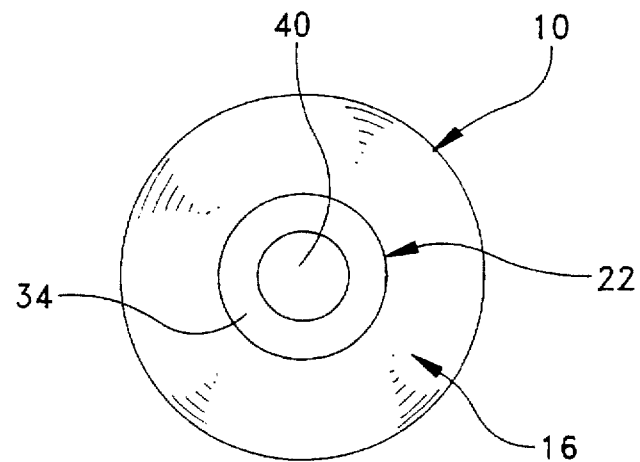
FIG. 2A is a plan view of an alternative circular configuration.
Figure 3:
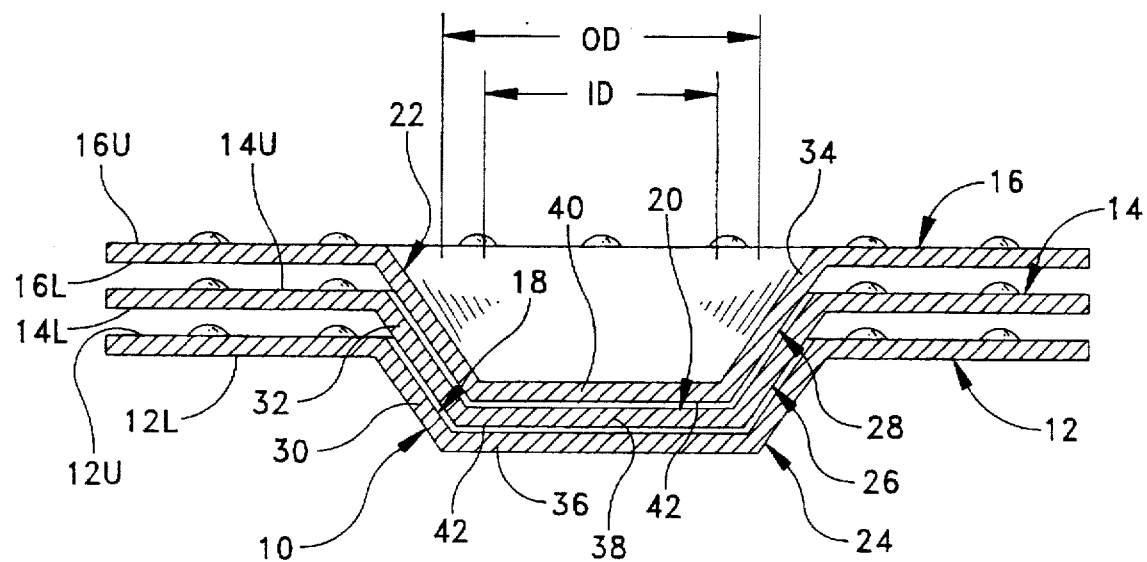
FIG. 3 is a cross-sectional view thereof taken along line 3—3 of FIG. 2.

Referring now to the drawings, the heat sink construction of the instant invention is illustrated and generally indicated at 10 in FIGS. 1–3. As will hereinafter be more fully described, the instant heat sink construction 10 is versatile and highly efficient, while also being relatively inexpensive to manufacture and assemble.

The heat sink construction 10 comprises a plurality of nested fin elements generally indicated at 12, 14, and 16. Each of the fin elements preferably comprises a thin sheet of metal, such as copper or aluminum, and includes a respective upper and lower surface generally designated as U and L. The described embodiment is illustrated as having a square peripheral outline, however, it is to be understood that other fin outlines, including for example, circular outlines, are also contemplated within the scope of te invention, and that such alternative configurations may be preferred under certain heat transfer conditions. Turning to FIG. 3, the upper surface U of each fin element 12, 14, and 16 includes a centrally located frusto-conical nesting recess generally indicated at 18, 20 and 22 while the lower surface L of each fin element 12, 14, 16 respectively includes a centrally located frusto-conical nesting shoulder 24, 26, 28 which is complementary in shape to the corresponding recess. The upper and lower surface areas surrounding the nesting formations 18–28 form the heat dissipating surfaces of the fin elements. Although the present embodiment is specifically illustrated as including three fin elements, it is to be understood that the present concept can be utilized with as few as two fin elements, or more than three fin elements without affecting the performance or manufacturability of the construction. Furthermore, it should be understood that while the nesting formations are preferably described as being centrally located, the position of the nesting formations can be located at, or near, the peripheral edges of the fin element depending on space constraints of the housing in which the heat sink is being used, or to maximize thermal transfer onto a specific area on the device to be cooled. Further still, it is to be understood that the shape of the nesting formation is not limited to circular cross-sections, and that the shape may also comprise square cross-sectional shapes, triangular, rectangular, or any other geometry suitable for the intended application.

The fin elements 12, 14, 16 are assembled in interfitting stacked relation such that the nesting shoulder of one fin element is received in nested relation within the recess of an adjacent fin element. For example, the shoulder 24 of fin 12 is snugly nested into the recess 20 of fin 14. In this regard, to permit full nesting of the shoulders and recesses, the outer dimension OD of the shoulder 24 is formed having the generally same inner dimension ID as the recess 20 of fin 14. The nesting formations 18–28 of the fin elements 12, 14, 16 are preferably formed by a stamping operation wherein the center portion of the thin metal fin elements 12, 14, 16 are each stamped with a different sized die to produce a recess on the stamped side while also forming the complementary shoulder on the opposing side. In this regard, it is pointed out that the side walls 30, 32, 34 of the nesting formations of consecutively nested fin elements are formed at about a 30 degree inward angle and that the side walls 30, 32, 34, and bottom walls 36, 38, 40 of the respective nesting formations must be formed in consecutively longer lengths and smaller diameters, i.e. wall 32 is longer than wall 30 and wall 34 is longer than wall 32, so that when the fin elements 12, 14, 16 are nested together, the heat dissipating surfaces of the adjacent fin elements are maintained in spaced relation and the outer side and bottom walls of the shoulders are nested in intimate facing thermal contact with the inner side and bottom walls of the recesses. The intimate thermal contact between the nested portions of the fin elements 12, 14, 16 provides a large laminar mass near the point of heat transfer for efficient heat transfer between a substrate to be cooled (not shown) and the heat sink 10, and the nested configuration provides a short and efficient thermal pathway for the heat to be transferred from the nesting formations to the heat dissipating surfaces of the heat sink construction 10.

To further enhance heat transfer between the fin elements 12, 14 16, the nested formations are preferably bonded together at their facing portions using a bonding material 42 appropriate to the particular metal used for the fin elements 12, 14, 16. For example, soldering, brazing, adhesive bonding, and spot welding are common methods for securing fin elements.

Still further, to enhance the heat dissipating efficiency of the fin elements 12, 14, 16, the heat dissipating surfaces of the fin elements may be provided with surface formations 44 to increase the effective heat dissipating surface area of the fin elements. The surface formations 44 are also preferably formed by a stamping or embossing operation to form small bumps and recesses on the surfaces. It is to be understood that the surface formations 44 need not be present in all embodiments, and in this regard, the surface formations may be entirely or partially eliminated to achieve spacing constraints, or minimize air flow impendance.

As can be readily derived from the above description of the preferred embodiment, the invention also provides a novel method of constructing a heat device comprising the steps of: providing a plurality of generally planar, metallic fin elements 12, 14, 16; embossing a nesting formation 18–28 in a central location in each of the fin elements whereby one surface of the fin element is provided with a first nesting formation, and the opposite side of the fin element is provided with a complementary nesting formation; and assembling the fin elements in interfitting stacked relation such that the nesting formation of one fin element is received in nested relation within complementary nesting formation of an adjacent fin element.

It can therefore be seen that the present invention provides a unique and versatile heat sink construction 10, as well as an effective and low cost method for manufacturing the same. Each of the fin elements 12, 14, 16 is quickly easily formed using well known stamping techniques. The nesting configurations of the fin elements, as well as the unique progressive increase in length of the nesting formations, provides the ability to concentrate substantial mass at the point of heat transfer, while also providing short efficient conduction paths from the nested portions to the heat dissipating portions. In terms of manufacturing, the stamped nesting formations are quickly and easily nested together for fast, efficient and low cost assembly of the devices. For these reasons, the instant invention is believed to represent a significant advancement in the heat sink art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A heat sink construction comprising a plurality of fin elements each having an upper and lower heat dissipating surface, said upper surface including a nesting recess, said lower surface including a nesting shoulder which is complementary in shape to said recess, said fin elements being assembled in interfitting stacked relation such that the shoulder of one fin element is received in nested relation within the recess of an adjacent fin element, said recess having inner side and bottom walls, said shoulder having outer side and bottom walls, said side walls of said recess and said shoulder being inwardly tapered from an outer edge thereof to said bottom wall, said fin elements being assembled such that said outer bottom walls of said shoulders are in intimate facing thermal contact with the inner bottom walls of said recesses and at least part of the outer side walls of said shoulders are in intimate facing thermal contact with the inner side walls of said recesses, said outer side walls of said shoulders of consecutively nested fin elements being consecutively longer in length such that the lower heat dissipating surface of one fin element is positioned in spaced adjacent relation to the upper heat dissipating surface of an adjacent fin element.

2. The heat sink construction of claim 1 further including means for bonding said fin elements together.

3. The heat sink construction of claim 1 wherein said heat dissipating surfaces include a plurality of surface formations which increase the effective surface area of said heat dissipating surfaces.

4. The heat sink construction of claim 3 wherein said surface formations comprise a plurality of embossed formations formed by stamping the heat dissipating surfaces with a die.

5. The heat sink construction of claim 4 wherein said recess and said shoulder are generally centrally located on said upper and lower surfaces.

6. The heat sink construction of claim 3 wherein said recess and said shoulder are generally centrally located on said upper and lower surfaces.

7. The heat sink construction of claim 1 wherein said recess and said shoulder are generally centrally located on said upper and lower surfaces.

* * * * *